United States Patent
Chen et al.

(10) Patent No.: US 11,692,643 B1
(45) Date of Patent: Jul. 4, 2023

(54) QUICK TOOLLESS CONNECTOR ASSEMBLY

(71) Applicant: Quanta Computer Inc., Taoyuan (TW)

(72) Inventors: Chao-Jung Chen, Taoyuan (TW); Yu-Nien Huang, Taoyuan (TW); Huan-Shu Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/843,226

(22) Filed: Jun. 17, 2022

Related U.S. Application Data

(60) Provisional application No. 63/269,960, filed on Mar. 25, 2022.

(51) Int. Cl.
*F16K 35/14* (2006.01)
*F16K 35/06* (2006.01)
*F16L 37/30* (2006.01)
*F16K 31/60* (2006.01)

(52) U.S. Cl.
CPC .............. *F16K 35/14* (2013.01); *F16K 35/06* (2013.01); *F16L 37/30* (2013.01); *F16K 31/602* (2013.01)

(58) Field of Classification Search
CPC ...... F16K 5/0647; F16K 31/602; F16K 35/06; F16K 35/14; F16K 35/025; F16L 37/28; F16L 37/30; F16L 37/32; F16L 37/33; F16L 37/36; F16L 37/373; F16L 37/38; F16L 37/44; F16L 37/47; F16L 37/34; F16L 37/35
USPC ......... 137/614, 614.06, 798; 251/148, 149.9, 251/151, 152
See application file for complete search history.

(56) References Cited

U.S. PATENT DOCUMENTS 2,948,553 A * 8/1960 Gill ........................ F16L 37/373
137/614.02
4,135,551 A * 1/1979 Knight .................. F16L 37/127
251/149.9

(Continued)

FOREIGN PATENT DOCUMENTS

CN  207621547 U  7/2018
EP  0809769 B1  12/2000

OTHER PUBLICATIONS

TW Office Action for Application No. 111134956, dated May 24, 2023, w/ First Office Action Summary.

(Continued)

*Primary Examiner* — Kevin F Murphy
*Assistant Examiner* — Jonathan J Waddy
(74) *Attorney, Agent, or Firm* — Nixon Peabody LLP

(57) ABSTRACT

A connector assembly includes a first and a second component. Each of the components including a connector body, a valve, a handle, a handle lock, and a connector lock. The handles open and close respective valves. Each of the handles has locked and unlocked positions. The handle locks prevent or inhibit the respective handles from being moved between open and closed positions. The handle locks in unlocked positions enable the respective handles to be moved between open and closed positions. The first and second components are configured to be releasably assembled with each other. The connector locks in their respective closed positions assist in preventing or inhibiting the disassembling of the first and second components.

14 Claims, 4 Drawing Sheets

(56) References Cited

U.S. PATENT DOCUMENTS

| | | | | |
|---|---|---|---|---|
| 4,271,865 | A | * | 6/1981 | Galloway ............... F16L 37/36 |
| | | | | 251/89.5 |
| 4,438,779 | A | * | 3/1984 | Allread ................. F16L 37/113 |
| | | | | 285/85 |
| 4,566,489 | A | | 1/1986 | Knapp et al. |
| 4,911,203 | A | * | 3/1990 | Garms .................. F16L 37/096 |
| | | | | 251/149.6 |
| 5,090,449 | A | * | 2/1992 | Fournier ................ F16K 35/14 |
| | | | | 137/637.05 |
| 5,099,883 | A | | 3/1992 | Maiville |
| 5,505,428 | A | * | 4/1996 | De Moss ................ F16L 37/47 |
| | | | | 251/368 |
| 2005/0082828 | A1 | * | 4/2005 | Wicks ..................... F16L 37/38 |
| | | | | 285/320 |
| 2010/0269933 | A1 | * | 10/2010 | Haunhorst .............. F16L 37/36 |
| | | | | 137/614.06 |
| 2015/0144208 | A1 | * | 5/2015 | Caccavo ............... F16K 17/285 |
| | | | | 137/512.2 |

OTHER PUBLICATIONS

TW Search Report for Application No. 111134956, dated May 24, 2023, w/ First Office Action.

* cited by examiner

QUICK TOOLLESS CONNECTOR ASSEMBLY

CROSS REFERENCE TO RELATED APPLICATIONS

This application claims priority to and the benefits of U.S. Provisional Patent No. 63/269,960 filed on Mar. 25, 2022 entitled "Quick Connect with Tooless Operated", the contents of which are hereby incorporated by reference herein in their entirety.

FIELD OF THE INVENTION

The present invention relates generally to connector assemblies and, more specifically, to connector assemblies used with piping in cooling systems that assist when maintenance or replacement of cooling system components is needed.

BACKGROUND OF THE INVENTION

Computer components, such as servers, include numerous electronic components that are powered by a common power supply. Servers generate an enormous amount of heat due to the operation of internal electronic devices such as controllers, processors, memory, and the like. Liquid cooling is the currently accepted solution for rapid heat removal due to the superior thermal performance from liquid cooling. Liquid cooling is performed using piping or tubes that carry cold and hot liquids or coolants.

Maintenance or repairing of components in these liquid coolant systems is needed from time to time. This maintenance or repairing often involves assembly/disassembly of different units or modules, which can be accomplished when the system contains coolant or even at a running status. During this maintenance or repairing, many of the current systems have disadvantages such as needing tooling, having high-flow resistant valves, large external forces to plug/unplug, or complex operation processes.

Thus, there is a need for a connector assembly that can be plug/unplugged quickly with the valve opening or closing easily during the maintenance or repairing.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a connector assembly comprises a first component and a second component. The first component includes a first connector body, a first valve, a first handle, a first handle lock, and a first connector lock. The first handle is configured to open and close the first valve. The first handle lock has locked and unlocked positions. The first handle lock, when in the locked position, prevents or inhibits the first handle from being moved between open and closed positions. The first handle lock, when in the unlocked position, enables the first handle to be moved between the open position and the closed position. The second component includes a second connector body, a second valve, a second handle, a second handle lock, and a second connector lock. The second handle is configured to open and close the second valve. The second handle lock has locked and unlocked positions. The second handle lock, when in the locked position, prevents or inhibits the second handle from being moved between open and closed positions. The second handle lock, when in the unlocked position, enables the second handle to be moved between the open position and the closed position. The first and second components are configured to be releasably assembled with each other. The first and second connector locks, when in their respective closed positions, assist in preventing or inhibiting the disassembling of the first and second components from each other.

According to a configuration of the above implementation, the first valve of the first component is a ball valve. In another embodiment, the second valve of the second component is a ball valve.

According to another configuration of the above implementation, the first component further includes at least one plug connector, and the second component further includes at least one projection with an aperture formed therein. The at least one plug connector is configured to be inserted into the aperture formed in the at least one projection. In another embodiment, the first component further includes a plurality of plug connectors, and the second component further includes a plurality of projections with each having an aperture formed therein. Each one of the plurality of plug connectors is configured to be inserted into a respective one of the apertures formed in the plurality of projections.

According to a further configuration of the above implementation, one of the plurality of plug connectors has an end having a notch therein, and one of the plurality of projections has an end having a notch therein. The notch of one of the plurality of plug connectors is configured to receive an end of the second connector lock. The notch of one of the plurality of projections is configured to receive an end of the first connector lock.

In a further aspect of the above implementation, the first handle in the open position extends above and adjacent to the one of the plurality of plug connectors having the notch therein and an end of the second connector lock. The second handle in the open position extends above and adjacent to the one of the plurality of projections having the notch therein and an end of the first connector lock.

In a further aspect of the above implementation, at least one of the first and second handle locks includes a plunger.

In yet a further aspect of the above implementation, the first and second handles move in a clockwise rotation. For operation requests, the handle could also move in a counterclockwise rotation. In another embodiment, the first and second handles when being rotated move the respective first and second connector locks outwardly and towards a periphery of the respective first and second components.

In yet a further aspect of the above implementation, the first component is a male component and the second component is a female component.

According to another aspect of the present disclosure, a method of using a connector assembly includes providing piping and providing a connector assembly. The connector assembly includes a first component and a second component. The first component includes a first connector body, a first valve, a first handle, a first handle lock, and a first connector lock. The first handle is configured to open and close the first valve. The first handle lock has locked and unlocked positions. The first handle lock, when in the locked position, prevents or inhibits the first handle from being moved between open and closed positions. The first handle lock, when in the unlocked position, enables the first handle to be moved between the open position and the closed position. The second component includes a second connector body, a second valve, a second handle, a second handle lock, and a second connector lock. The second handle is configured to open and close the second valve. The second handle lock has locked and unlocked positions. The second handle lock, when in the locked position, prevents or inhibits the second handle from being moved between open and closed positions. The second handle lock, when in the unlocked position, enables the second handle to be moved between the open position and the closed position. The first handle lock is unlocked or released. The first handle is moved from the closed position to the open position such that the first valve is moved to the open position. The first handle lock is locked after the first handle has been moved to the open position. The second handle lock is unlocked or released. The second handle is moved from the closed position to the open position such that the second valve is moved to the open position. The second handle lock is locked after the second handle has been moved to the open position.

According to a configuration of the above implementation, the unlocking and moving steps are performed in the absence of tooling.

According to a configuration of the above implementation, the first and second valves of the first component are ball valves.

According to another configuration of the above implementation, the first component further includes at least one plug connector, and the second component further includes at least one projection with an aperture formed therein. The at least one plug connector is configured to be inserted into the aperture formed in the at least one projection. In another embodiment, the first component further includes a plurality of plug connectors, and the second component further includes a plurality of projections with each having an aperture formed therein. Each one of the plurality of plug connectors is configured to be inserted into a respective one of the apertures formed in the plurality of projections.

According to a further configuration of the above implementation, one of the plurality of plug connectors has an end having a notch therein, and one of the plurality of projections has an end having a notch therein. The notch of one of the plurality of plug connectors is configured to receive an end of the second connector lock. The notch of one of the plurality of projections is configured to receive an end of the first connector lock.

In a further aspect of the above implementation, the first handle in the open position extends above and adjacent to the one of the plurality of plug connectors having the notch therein and an end of the second connector lock. The second handle in the open position extends above and adjacent to the one of the plurality of projections having the notch therein and an end of the first connector lock.

In a further aspect of the above implementation, at least one of the first and second handle locks includes a plunger.

In yet a further aspect of the above implementation, the first and second handles move in a clockwise rotation. For operation requests, the handle could also move in a counterclockwise rotation. In another embodiment, the first and second handles when being rotated move the respective first and second connector locks outwardly and towards a periphery of the respective first and second components.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
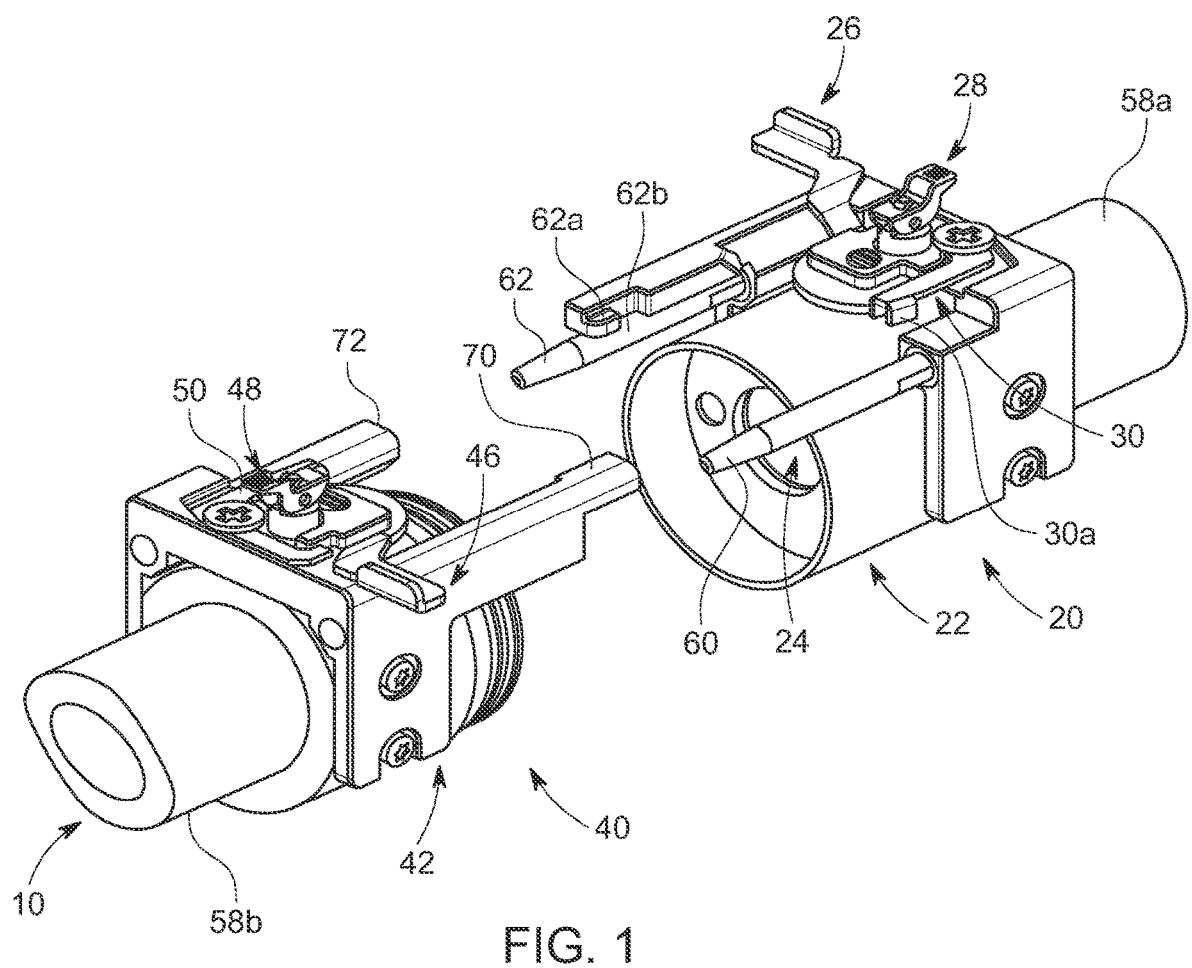
FIG. 1 is a perspective view of a connector assembly in an unassembled position according to one embodiment.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The connector assemblies of the present invention are advantageous for several reasons. The connector assemblies can be used without or in the absence of additional tooling. Thus, the connector assemblies can be toollessly operated in opening and closing the valves. The service of various components can be easily serviced when using the connector assemblies of the present invention. The connector assemblies are easy to use in both plugging and unplugging, was well as operating the valve between closed and open positions when maintaining or replacing equipment.

Referring to FIG. 1, a connector assembly 10 includes a first component 20 and a second component 40 in an unassembled position. The first component 20 includes a first connector body 22, a first valve 24, a first handle 26, a first handle lock 28, and a first connector lock 30. The first handle 26 is configured to open and close the first valve 24. The first handle lock 28 has a locked and an unlocked position. These positions can also be referred to as engaged or unengaged positions. The first handle lock 28, when in the locked position, prevents or inhibits the first handle 26 from being moved between open and closed positions. This is accomplished in one embodiment by using a plunger that moves vertically. The first handle lock 28, when in the unlocked position, enables the first handle 26 to be moved between open and closed positions. The first component 20 is a male connector.

Figure 2A:
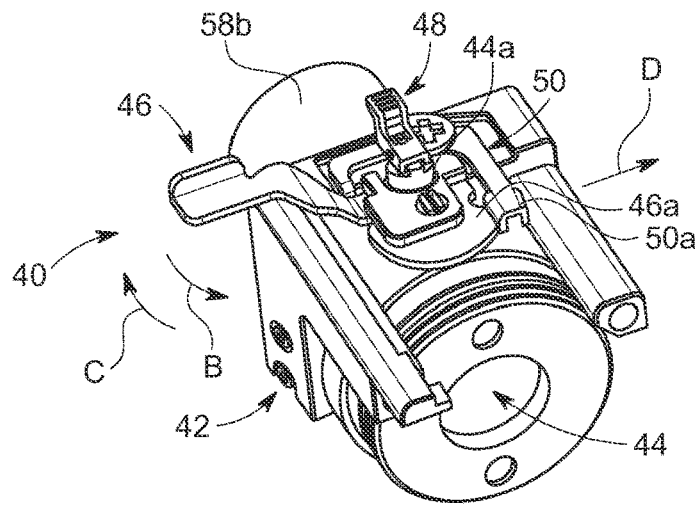
FIG. 2A is a top perspective view of a second component used in the connector assembly of FIG. 1 according to one embodiment in which a valve and a handle are in closed positions.

Referring to FIGS. 1 and 2A, the second component 40 includes a second connector body 42, a second valve 44, a second handle 46, a second handle lock 48, and a second connector lock 50. The first and second valves 24, 44 in one embodiment are ball valves.

The second handle 46 is configured to open and close the second valve 44. The second handle lock 48 has a locked and an unlocked position. The second handle lock 48 functions similarly as the first handle lock 28. The second handle lock 48, when in the locked position, prevents or inhibits the second handle 46 from being moved between open and closed positions. The second handle lock 48, when in the unlocked position, enables the second handle 46 to be moved between open and closed positions. As will be discussed below with respect to FIG. 3B, the first component 20 is configured to be releasably assembled or connected with the second component 40. The second component 40 is a female connector. The first component 20 and the second component 40 have different geometries (e.g., the first connector body 22 and the second connector body 42 are different). As will be described below, the remaining features of the first and second components 20, 40 are generally similar. It is contemplated that some of the components may be configured differently than shown and discussed below.

Figure 2B:
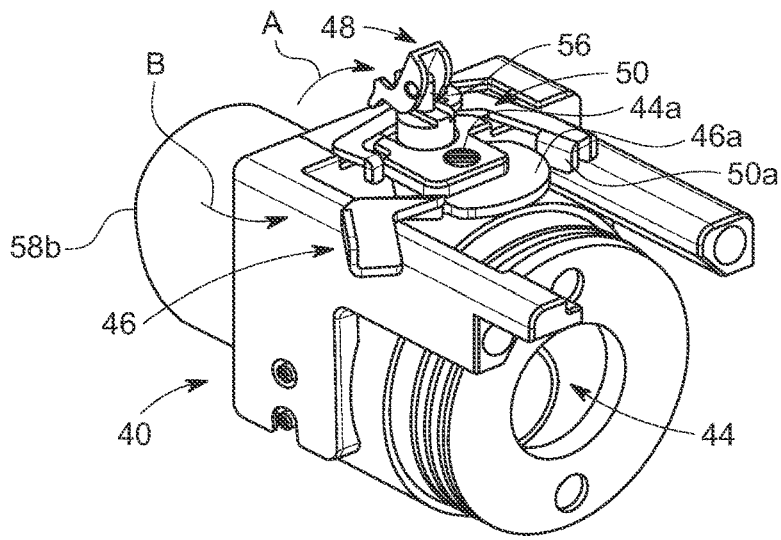
FIG. 2B is a side perspective view of the second component of FIG. 2A in which a handle lock is in an unlocked position and a handle is in the process of being moved to a fully open position.
Figure 2C:
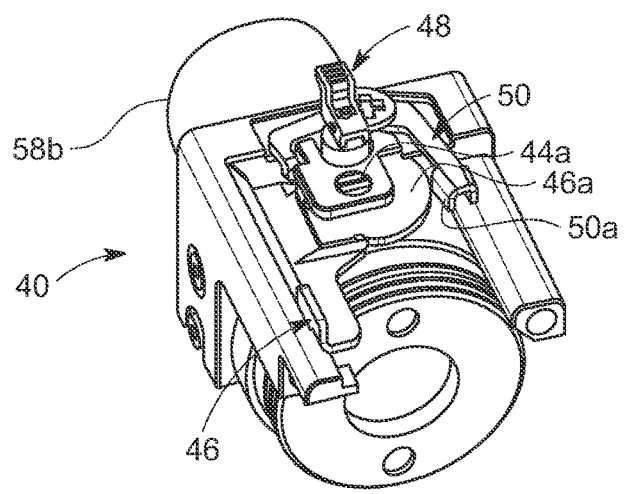
FIG. 2C is a top perspective view of the second component of FIG. 2A in which a valve and a handle are in fully open positions.

Referring to FIGS. 2A-2C, various positions or statuses of the second component 40 to be used in the connector assembly 10 of FIG. 1 are shown. Referring initially to FIG. 2A, the second handle 46 and the second valve 44 are shown in closed positions. When either of the valves 24, 44 are in a closed position, any liquid or coolant cannot pass through the connector assembly 10. Thus, the liquid or coolant is sealed. The second handle lock 48 of FIG. 2A is engaged in a locked position such that the second handle 46 cannot be moved. The second handle lock 48 includes a plunger that engages the second handle 46. The plunger in FIG. 2A is in a downward position and is not shown. Thus, the second handle 46 is in a closed and locked position in FIG. 2A. By having the second handle 46 in a locked position, this prevents or inhibits the second handle 46 from being moved accidently to an open position.

In this position of FIG. 2A, the second connector lock 50 is in an open position. The second handle 46 assists in fixing the second connector lock 48 in an open position. As will be discussed below, when the second connector lock 50 is in an open position, the first component 20 and the second component 40 are allowed to plug or unplug with each other (i.e., to be assembled or unassembled).

Referring to FIG. 2B, for the second handle 46 to be moved from the closed position, the second handle lock 48 needs to be released from its closed position (FIG. 2A) to an open position (FIG. 2B). This is accomplished by a user pivoting or moving the second handle lock 48 along the general direction of arrow A in FIG. 2B. By pivoting or moving the second handle lock 48 in the direction of arrow A, a plunger 56 is moved upwardly, which allows the second handle 46 to gain clearance such that it can be moved or rotated from its closed position of FIG. 2A to its positions in FIGS. 2B, 2C.

After the second handle lock 48 is released to an unlocked position, a user can move or rotate the second handle 46 along the general direction of arrow B as shown in FIGS. 2A, 2B. As the second handle 46 is being rotated or opened, the second valve 44 is being opened and the second handle 46 drives or turns the second connector lock 50. In this embodiment, the second valve 44 is a ball valve. The second handle 46 is connected to an upper portion 44a of the second valve 44. As the second handle 46 is rotated, the upper portion 44a of the second valve 44 is also rotated, resulting in the opening of the ball valve 44 as shown in FIGS. 2B, 2C. FIG. 2B shows the ball valve 44 in a partially open position, while the ball valve 44 in FIG. 2C is in a fully open position. Similarly, when the second handle 46 is rotated in the direction of Arrow C (see FIG. 2A), it closes the ball valve 44.

A generally circular portion 46a of the second handle 46 contacts the second connector lock 50 and then moves or turns the second connector lock 50 in an outwardly direction (direction of arrow D in FIG. 2A). This direction is towards a periphery of the second component 40. The movement of the second connector lock 50 and the second valve 44 occurs at the same time in this embodiment.

Turning to FIG. 2C, the second handle 46 has been moved from the closed position (FIG. 2A) to the fully open position of FIG. 2C. During this movement, the second handle lock 48 will be in an open or released position as shown in FIG. 2B. The position of the second handle lock 48 of FIG. 2C is in a locked position such that the second handle 46 cannot be moved from the position shown in FIG. 2C. In this position, the second valve 44 is in the fully open position and will allow liquid or coolant to pass therethrough.

As the second handle 46 is being rotated from the position of FIG. 2B to the position of FIG. 2C, the generally circular portion 46a of the second handle 46 continues to contact the second connector lock 50 and moves the second connector lock 50 in an outwardly direction (direction of arrow D). In the position of the second connector lock 50 in FIG. 2C, as will be discussed below, the connector assembly 10 is not allowed to plug or unplug.

The first component 20 functions in the same or similar manner as described above with respect the second component 40 in conjunction with FIGS. 2A-2C. Specifically, the first valve 24, the first handle 26, the first handle lock 28, and the first connector lock 30 function in a similar manner as the second valve 44, the second handle 46, the second handle lock 48, and the second connector lock 50, respectively.

Figure 3A:
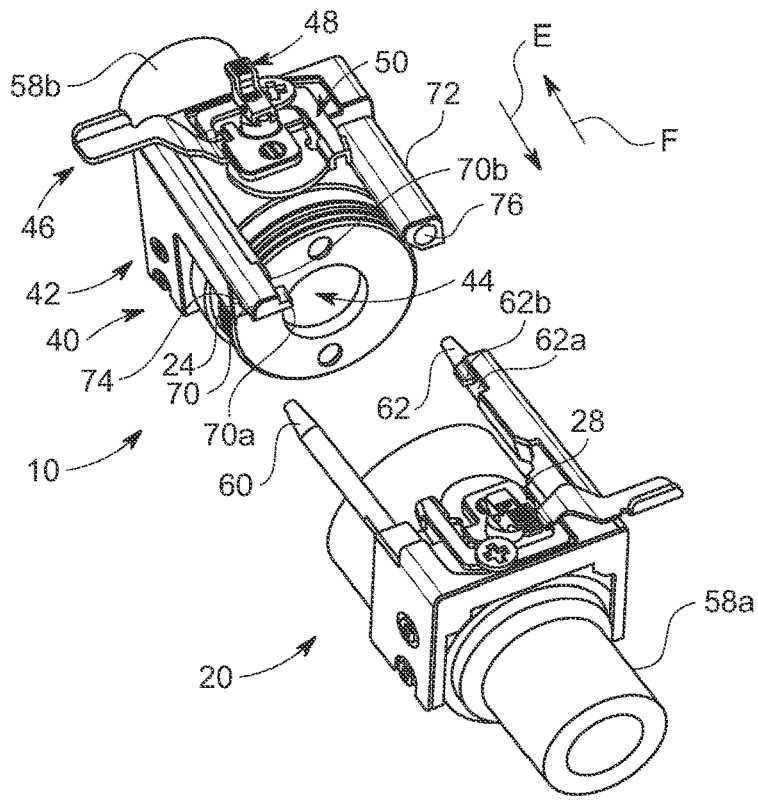
FIG. 3A is a top perspective view of the connector assembly in an unassembled position of FIG. 1.
Figure 3B:
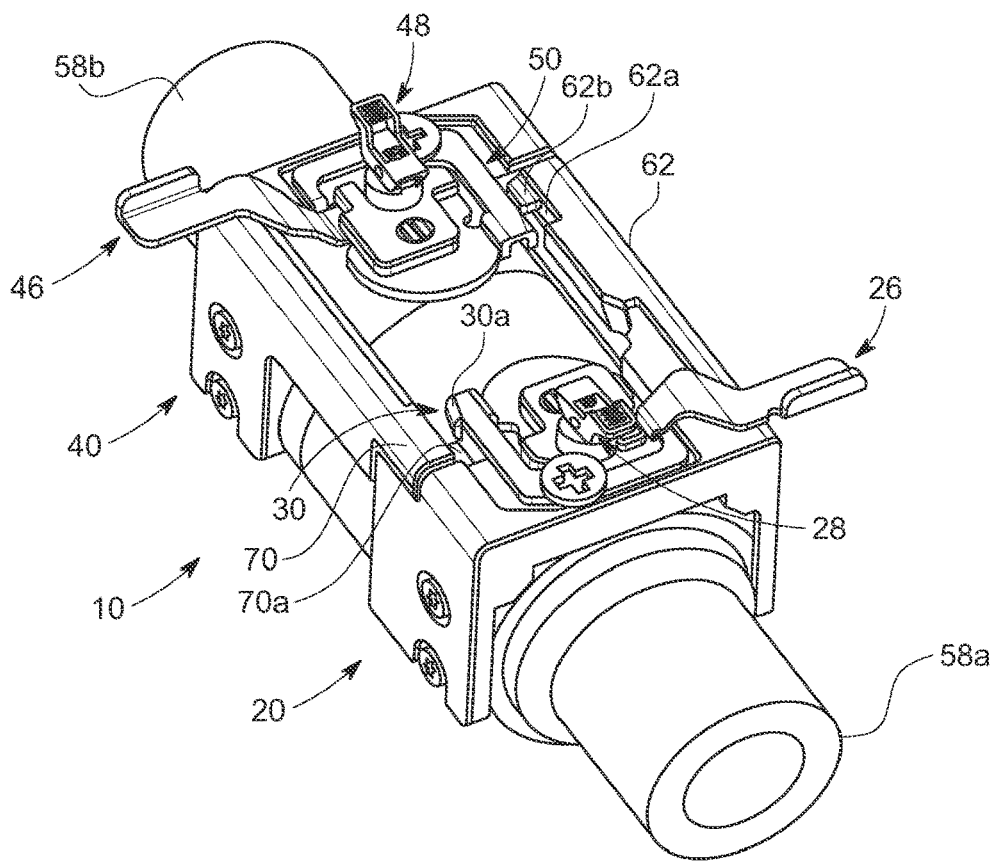
FIG. 3B is a top perspective view of the connector assembly of FIG. 3A being assembled in which the first and second valves and the first and second handles are in closed positions.

Referring to FIGS. 3A, 3B, the connector assembly 10 is shown in an unassembled position (FIG. 3A) with the first and second components 20, 40 being separated from each other. In one method, the second component 40 is moved in the direction of arrow E such the first component 20 and the second component 40 can be plugged such as shown in the assembled position of FIG. 3B. In another method, the first component 20 and the second component 40 are in an assembled position of FIG. 3B after moving the second component 40 in the direction of arrow F and plugging with the first component 20. It is contemplated that both the first component 20 and the second component 40 may be moved together to the assembled position of FIG. 3B.

As shown best in FIGS. 1 and 3A, the first component 20 has a plurality of plug connectors 60, 62, while the second component 40 includes a plurality of projections 70, 72. Each of the projections 70, 72 has a respective aperture 74, 76 formed therein. The first plug connector 60 is adapted to be inserted into the aperture 74 of the first projection 70. The second plug connector 62 is adapted to be inserted into the aperture 76 of the second projection 72. The second plug connector 62 at one end includes a thinned ledge 62a and a notch 62b. The projection second plug connector 70 at one end includes a thinned ledge 70a and a notch 70b.

The first and second plug connectors 60, 62 and the first and second projections 70, 72 assist in aligning the first component 20 and the second component 40 in an assembled position. To obtain the proper alignment in this embodiment, the first and second plug connectors 60, 62 need to be fully inserted into the respective apertures 74, 76 of the first and second projections 70, 72.

The connector assembly 10 in FIG. 3B is in an assembled position in which the ball valves 24, 44 (See FIGS. 1, 2A) are closed. Thus, no liquid can be transported through the connector assembly 10 in this position.

Figures 4A, 4B:
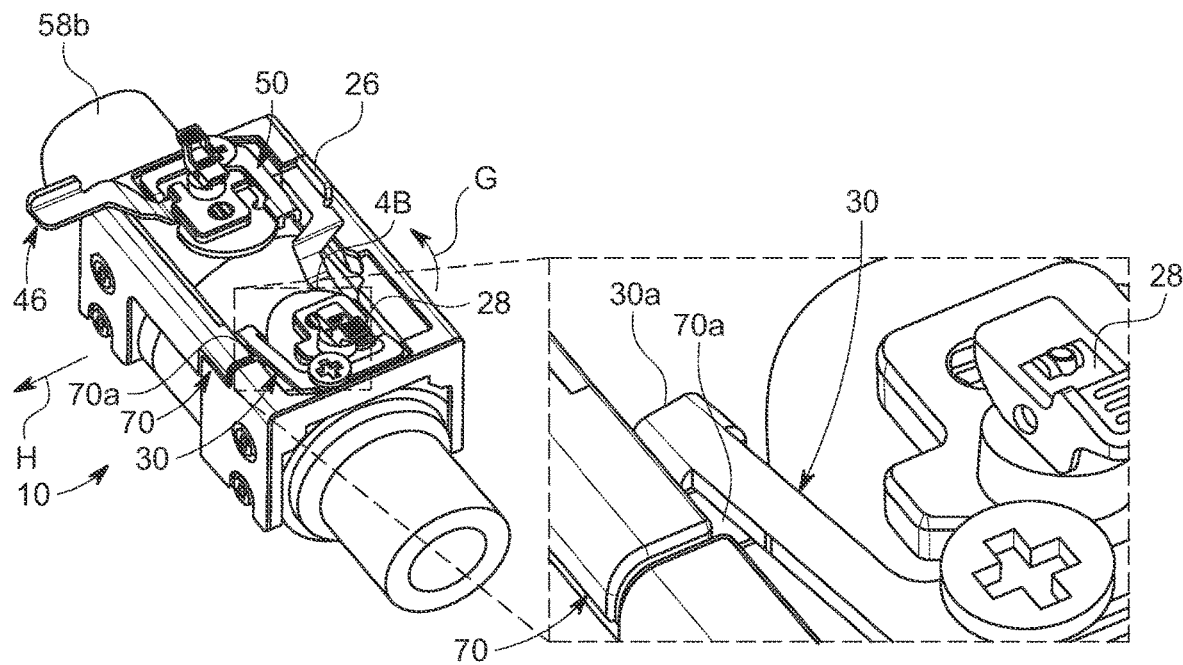
FIG. 4A is a top perspective view of the connected assembly of FIG. 3B in which the first valve and the first handle are in open positions, and the second valve and the second handle are in closed positions.
FIG. 4B is an enlarged view of the generally rectangular area 4B in FIG. 4A.

The connector assembly 10 of FIG. 3B can be moved to a position where liquid or coolant can be transported therethrough as shown in FIGS. 4A-4D. Referring initially to FIG. 4A, the first handle 26 has been moved along the general direction of arrow G. In this position, the first valve 24 is in a fully open position. The second valve 44, however, remains in the closed position. When the first handle 26 is being moved to the position of FIG. 4A, the first connector lock 30 is moved outwardly (in the direction of arrow H in FIG. 4A). As shown in FIG. 4B, the first connector lock 30 will abut or be pressed into the notch 70b (see also FIG. 3A) formed at the end of the first projection 70.

Figures 4C, 4D:
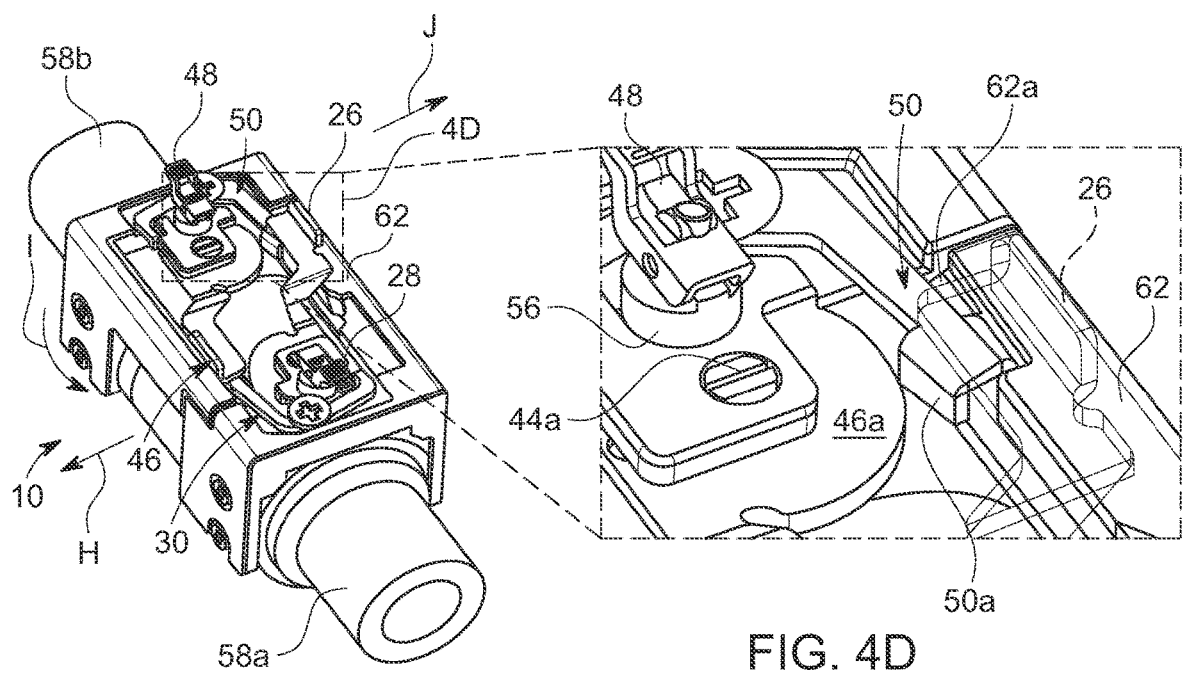
FIG. 4C is a top perspective view of the connected assembly of FIG. 3B in which the first valve and the first handle are in open positions, and the second valve and the second handle are in open positions.
FIG. 4D is an enlarged view of the generally rectangular area 4D in FIG. 4C.

Referring to FIG. 4C, the second handle 46 has been moved along the general direction of arrow I. In this position, the second valve 44 is also in the fully open position. Thus, both first and second valves 24, 44 are in their fully open positions, which allow liquid or coolant to flow through the connector assembly 10. When the second handle 46 is moved as shown in FIG. 4C, the second connector lock 50 is moved outwardly (in the direction of arrow J in FIG. 4C). As shown in FIG. 4B, the second connector lock 50 will abut or be pressed into the notch 62b (see also FIG. 3A) formed at the end of the second plug connector 62.

When both of the first and second handles 26, 46 are in the fully open positions, both of the valves 24, 44 (see FIGS. 1, 2C) will be open. As shown in FIG. 4D, the first handle 26 is shown in phantom lines such that the positioning of the second connector lock 50 relative to the second plug connector 62 can be seen. In this position, an end 50a of the second connector lock 50 is pressed into the notch 62b of the second plug connector 62. When in this position, the second plug connector 62 and the second projection 72 are fixed in the plugged position. Similarly, an end 30a of the first connector lock 30 is pressed into the notch 70b (see FIG. 3A) adjacent to the thinned ledge 70a of the first projection 70. When in this position, the first projection 70 and the first plug connector 60 are fixed in the plugged position.

The first handle 26 in the open position extends above and adjacent to the plug connector 62 having the notch 62a therein and an end of the second connector lock 50. Similarly, the second handle 46 in the open position extends above and adjacent to the first projection 70 having the notch 70b therein and an end of the first connector lock 30.

If the user wishes to disassembly the connector assembly 10, the first and second handles 26, 46 are rotated back to the position of FIG. 3B after the first and second handle locks 28, 48 are released, which closes the valves 24, 44 and unlocks the first and second connector locks 30, 50. Then, the first component 20 and second component 40 may be moved away from each other by unplugging the first and second plug connectors 60, 62 from the respective projections 70, 72, while still having the liquid or coolant being sealed.

It is contemplated that other types of plunger or non-plungers may be used in other embodiments. For example, a pressable button mechanism may be used that when pressed in a downward direction, the mechanism releases, for example, a plurality of pins. Once the plurality of pins is released, the handle may be rotated as described above. After the rotation of the handle is completed or finished, the pressable button mechanism is returned in an upward direction and the plurality of pins lock the handle. The pressable button mechanism in one embodiment is returned in an upward direction by the movement of the handle. In another embodiment, the pressable button mechanism is moved (e.g., toggled) by a user in an upward direction.

As shown in FIGS. 1 and 3B, for example, the connector assembly 10 is located with piping 58a, 58b. The piping 58a, 58b has a generally circular or oval cross-section. It is contemplated that the piping may be other shapes including polygonal shapes or other non-polygonal shapes. For example, the piping may have a cross-section being a polygonal shape (e.g., a square or a rectangle).

The piping to be used with the connector assemblies of the present invention can transport various liquids or coolants therein. The coolants are typically thermally-conductive, dielectric liquid coolants. The coolant assists in removing heat generated from heat-generating components by directly contacting those components. The liquids to be used as the coolant typically have very good insulating properties so that contact with heat-generated components can be accomplished in a safe manner. The coolant changes between its liquid and vapor phases easily and at a desired temperature.

The type of coolant is selected based on the requirement of thermal design. Non-limiting examples of coolants include fluorocarbons, water (e.g., deionized water, mixtures including water, and hydrocarbons. It is contemplated that other coolants may be used that can remove and absorb heat from the heat-generating components stored within the tank. The various liquids or coolants are typically either cold or hot liquid. In other embodiments, the liquids may be closer to or at room temperature.

In one method, the connector assemblies are used in both cold and hot liquid piping. In one method, piping with a connector assembly is used with an immersion liquid cooling tank including manifolds that are connected to respective cold and hot piping. It is contemplated that the connector assemblies may be used in other piping applications.

Non-limiting examples of heat-generating components that may be contained within an immersion liquid cooling tank assembly include, but are not limited to, storage servers, application servers, switches, or other electronic devices. Examples include, but are not limited to, central processing units (CPU), dual in-line memory modules (DIMM), network cards, a hard disk drives (HDD), solid state drives (SSD), graphics processing units (GPU) or field programmable gate arrays (FPGA).

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A connector assembly comprising:
a first component including a first connector body, a first valve, a first handle, a first handle lock, and a first connector lock, the first handle being configured to open and close the first valve, the first handle lock having locked and unlocked positions, the first handle lock in the locked position preventing or inhibiting the first handle from being moved between open and closed positions, the first handle lock in the unlocked position enabling the first handle to be moved between the open position and the closed position; and
a second component including a second connector body, a second valve, a second handle, a second handle lock, and a second connector lock, the second handle being configured to open and close the second valve, the second handle lock having locked and unlocked positions, the second handle lock in the locked position preventing or inhibiting the second handle from being moved between open and closed positions, the second handle lock in the unlocked position enabling the second handle to be moved between the open position and the closed position,
wherein the first and second components are configured to be releasably assembled with each other,
wherein the first and second connector locks, when in their respective closed positions, assist in preventing or inhibiting the disassembling of the first and second components from each other,
wherein the first component further includes at least one plug connector, and the second component further includes at least one projection with an aperture formed therein, the at least one plug connector being configured to be inserted into the aperture formed in the at least one projection, wherein the first component further includes a plurality of plug connectors, and the second component further includes a plurality of projections with each having an aperture formed therein, each one of the plurality of plug connectors being configured to be inserted into a respective one of the apertures formed in the plurality of projections, wherein one of the plurality of plug connectors has an end having a notch therein, and one of the plurality of projections has an end having a notch therein, wherein the notch of one of the plurality of plug connectors is configured to receive an end of the second connector lock, and wherein the notch of one of the plurality of projections is configured to receive an end of the first connector lock.

2. The assembly of claim 1, wherein the first valve of the first component is a ball valve.

3. The assembly of claim 2, wherein the second valve of the second component is a ball valve.

4. The assembly of claim 1, wherein the first handle in the open position extends above and adjacent to the one of the plurality of plug connectors having the notch therein and the end of the second connector lock, and wherein the second handle in the open position extends above and adjacent to the one of the plurality of projections having the notch therein and the end of the first connector lock.

5. The assembly of claim 1, wherein at least one of the first and second handle locks includes a plunger.

6. The assembly of claim 1, wherein the first and second handles move in a clockwise or counterclockwise rotation.

7. The assembly of claim 6, wherein the first and second handles when being rotated, move the respective first and second connector locks outwardly and towards a periphery of the respective first and second components.

8. The assembly of claim 1, wherein the first component is a male component and the second component is a female component.

9. A method of using a connector assembly, the method comprising:

providing piping;

providing a connector assembly, the connector assembly including a first component and a second component, the first component including a first connector body, a first valve, a first handle, a first handle lock, and a first connector lock, the first handle being configured to open and close the first valve, the first handle lock having locked and unlocked positions, the first handle lock in the locked position preventing or inhibiting the first handle from being moved between open and closed positions, the first handle lock in the unlocked position enabling the first handle to be moved between the open position and the closed position, the second component including a second connector body, a second valve, a second handle, a second handle lock, and a second connector lock, the second handle being configured to open and close the second valve, the second handle lock having locked and unlocked positions, the second handle lock in the locked position preventing or inhibiting the second handle from being moved between open and closed positions, the second handle lock in the unlocked position enabling the second handle to be moved between the open position and the closed position;

unlocking or releasing the first handle lock;

moving the first handle from the closed position to the open position such that the first valve is moved to the open position;

locking the first handle lock after the first handle has been moved to the open position;

unlocking or releasing the second handle lock;

moving the second handle from the closed position to the open position such that the second valve is moved to the open position; and locking the second handle lock after the second handle has been moved to the open position, wherein the first component further includes at least one plug connector, and the second component further includes at least one projection with an aperture formed therein, the at least one plug connector being configured to be inserted into the aperture formed in the at least one projection, wherein the first component further includes a plurality of plug connectors, and the second component further includes a plurality of projections with each having an aperture formed therein, each one of the plurality of plug connectors being configured to be inserted into a respective one of the apertures formed in the plurality of projections, wherein one of the plurality of plug connectors has an end having a notch therein, and one of the plurality of projections has an end having a notch therein, wherein the notch of one of the plurality of plug connectors is configured to receive an end of the second connector lock, and wherein the notch of one of the plurality of projections is configured to receive an end of the first connector lock.

10. The method of claim 9, wherein the unlocking and moving steps are performed in the absence of tooling.

11. The method of claim 9, wherein the first valve of the first component is a ball valve, and the second valve of the second component is a ball valve.

12. The method of claim 9, wherein the first handle, in the open position, extends above and adjacent to the one of the plurality of plug connectors having the notch therein and the end of the second connector lock, and wherein the second handle, in the open position, extends above and adjacent to the one of the plurality of projections having the notch therein and the end of the first connector lock.

13. The method of claim 9, wherein at least one of the first and second handle locks includes a plunger.

14. The method of claim 9, wherein the first and second handles move in a clockwise or counterclockwise rotation.

* * * * *